(12) United States Patent
Ranjan et al.

(10) Patent No.: US 8,498,150 B2
(45) Date of Patent: Jul. 30, 2013

(54) NON-VOLATILE MAGNETIC MEMORY ELEMENT WITH GRADED LAYER

(75) Inventors: Rajiv Yadav Ranjan, San Jose, CA (US); Parviz Keshtbod, Los Altos Hills, CA (US); Roger Klas Malmhall, San Jose, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 13/476,944

(22) Filed: May 21, 2012

(65) Prior Publication Data

US 2013/0087872 A1  Apr. 11, 2013

Related U.S. Application Data

(62) Division of application No. 13/253,918, filed on Oct. 5, 2011, now Pat. No. 8,399,943, and a division of application No. 13/253,916, filed on Oct. 5, 2011, now Pat. No. 8,399,942.

(51) Int. Cl.
 *G11C 11/14* (2006.01)

(52) U.S. Cl.
 USPC ........... 365/171; 365/148; 365/158; 977/933; 977/935

(58) Field of Classification Search
 USPC ................ 365/48, 55, 62, 66, 74, 78, 80–93, 365/100, 130, 131, 148, 158, 171–173, 209, 365/213, 225.5, 230.07, 232, 243.5; 257/295, 257/421, E21.665; 438/3; 977/933–935
 See application file for complete search history.

(56) References Cited

U.S. PATENT DOCUMENTS

| 7,208,807 | B2 * | 4/2007 | Horng et al. ................... 257/421 |
| 2002/0191451 | A1 | 12/2002 | Kishi |
| 2005/0254286 | A1 | 11/2005 | Valet |
| 2006/0114620 | A1 | 6/2006 | Sbiaa |
| 2007/0015293 | A1 * | 1/2007 | Wang et al. ....................... 438/3 |
| 2007/0034919 | A1 * | 2/2007 | Wang et al. ................... 257/295 |
| 2008/0191295 | A1 * | 8/2008 | Ranjan et al. ................. 257/421 |
| 2009/0161266 | A1 * | 6/2009 | Wang et al. ................ 360/324.1 |

* cited by examiner

*Primary Examiner* — Alexander Sofocleous
*Assistant Examiner* — Harry W Byrne
(74) *Attorney, Agent, or Firm* — Maryam Imam; IPxLAW Group LLP

(57) ABSTRACT

A non-volatile magnetic memory element includes a number of layers one of which is a free layer which is graded. The graded free layer may include various elements with each element having a different anisotropy or it may include non-magnetic compounds and magnetic regions with the non-magnetic compounds forming graded contents forming a unique shape such as cone shaped, diamond shaped or other shapes and whose thickness is based on the reactivity of the magnetic compound.

32 Claims, 10 Drawing Sheets

NON-VOLATILE MAGNETIC MEMORY ELEMENT WITH GRADED LAYER

CROSS REFERENCE TO RELATED APPLICATIONS

This application is a divisional application of U.S. patent application Ser. No. 13/253,918, filed on Oct. 5, 2011, by Rajiv Yadav Ranjan, and entitled "Non-Volatile Magnetic Memory Element with Graded Layer" and U.S. patent application Ser. No. 13/253,916, filed on Oct. 5, 2011, by Rajiv Yadav Ranjan, and entitled "Non-Volatile Magnetic Memory Element with Graded Layer", both of which claim priority to U.S. patent application Ser. No. 11/776,692, filed on Jul. 12, 2007, by Rajiv Yadav Ranjan, and entitled "Non-Volatile Magnetic Memory Element With Graded Layer", which is a continuation-in-part of U.S. patent application Ser. No. 11/740,861, entitled "A High Capacity Low Cost Multi-Stacked Cross Line Magnetic Memory", filed on Apr. 26, 2007, which is a continuation-in-part of U.S. patent application Ser. No. 11/739,648 entitled "Non-Volatile Magnetic Memory With Low Switching Current And High Thermal Stability", filed on Apr. 24, 2007, which is a continuation-in-part of U.S. patent application Ser. No. 11/678,515 entitled "A High Capacity Low Cost Multi-State Magnetic Memory", filed on Feb. 23, 2007, which is a continuation-in-part of U.S. patent application Ser. No. 11/674,124 entitled "Non-uniform Switching Based Non-Volatile Magnetic Base Memory", filed on Feb. 12, 2007, the disclosures of which are incorporated herein by reference, as though set forth in full.

BACKGROUND OF THE INVENTION

1. Field of the Invention

The present invention relates generally to non-volatile magnetic memory and particularly to non-volatile magnetic memory having graded layer(s).

2. Description of the Prior Art

Computers conventionally use rotating magnetic media, such as hard disk drives (HDDs), for data storage. Though widely used and commonly accepted, such media suffer from a variety of deficiencies, such as access latency, higher power dissipation, large physical size and inability to withstand any physical shock. Thus, there is a need for a new type of storage device devoid of such drawbacks.

Other dominant storage devices are dynamic random access memory (DRAM) and static RAM (SRAM) which are volatile and very costly but have fast random read/write access time. Solid state storage, such as solid-state-nonvolatile-memory (SSNVM) devices having memory structures made of NOR/NAND-based Flash memory, providing fast access time, increased input/output (IO) speed, decreased power dissipation and physical size and increased reliability but at a higher cost which tends to be generally multiple times higher than hard disk drives (HDDs).

Although NAND-based flash memory is more costly than HDD's, it has replaced magnetic hard drives in many applications such as digital cameras, MP3-players, cell phones, and hand held multimedia devices due, at least in part, to its characteristic of being able to retain data even when power is disconnected. However, as memory dimension requirements are dictating decreased sizes, scalability is becoming an issue because the designs of NAND-based Flash memory and DRAM memory are becoming difficult to scale with smaller dimensions. For example, NAND-based flash memory has issues related to capacitive coupling, few electrons/bit, poor error-rate performance and reduced reliability due to decreased read-write endurance. Read-write endurance refers to the number of reading, writing and erase cycles before the memory starts to degrade in performance due primarily to the high voltages required in the program, erase cycles.

It is believed that NAND flash would be extremely difficult to scale below 45 nanometers (nm). Likewise, DRAM has issues related to scaling of the trench capacitors leading to very complex designs which are becoming increasingly difficult to manufacture, leading to higher cost.

Currently, applications commonly employ combinations of EEPROM/NOR, NAND, HDD, and DRAM memory in a system design. Design of different memory technology in a product adds to design complexity, time to market and increased costs. For example, in hand-held multi-media applications incorporating various memory technologies, such as NAND Flash, DRAM and EEPROM/NOR flash memory, complexity of design is increased as are manufacturing costs and time to market. Another disadvantage is the increase in size of a device that incorporates all of these types of memories therein.

There has been an extensive effort in development of alternative technologies, such as Ovanic random access memory (RAM) (or phase-change memory), Ferro-electric RAM (Fe-RAM), Magnetic RAM (MRAM), probe-storage, made by Nanochip, Inc. of Fremont, Calif., and others to replace memories used in current designs such as dynamic RAM (DRAM), static RAM (SRAM), electrically erasable and programmable read-only-memory (EEPROM)/NOR flash, NAND flash and hard disk drive (HDD) in one form or another. Although these various memory/storage technologies have created many challenges, there have been advances made in this field in recent years. MRAM seems to lead the way in terms of its progress in the past few years to replace all types of memories in the system as a universal memory solution.

One of the problems with prior art memory structures including MRAMs is their cell or memory size being too large therefore not lending itself well to scalability. A typical design of such MRAMs uses one or more transistors for one memory cells that lead to nT-1mem cell type design where n=1-6. This makes the cell size too large leading to issues of scalability and cost. Recently, current-induced magnetization switching (CIMS) is being explored as an alternative memory solution, and allegedly introduces a better way of building higher capacity MRAM type memory. But memories based on MRAM tend to have larger cell size ($16$-$24F^2$, where F is the minimum feature based on the lithography technology). There is also a tradeoff between low-switching current, and reliability of the memory associated with thermal stability.

Therefore, in light of the foregoing, what is needed is a non-volatile magnetic memory element, which has both low switching current while exhibiting improved reliability.

SUMMARY OF THE INVENTION

To overcome the limitations in the prior art described above, and to overcome other limitations that will become apparent upon reading and understanding the present specification, the present invention discloses a method and a corresponding structure for a non-volatile magnetic storage memory device that is based on current-induced-magnetization-switching having reduced switching current in the magnetic memory and high memory capacity.

Briefly, an embodiment of the present invention includes a non-volatile magnetic memory element formed of a fixed layer on top of which is formed a tunnel layer on top of which is formed a graded free layer.

These and other objects and advantages of the present invention will no doubt become apparent to those skilled in the art after having read the following detailed description of the preferred embodiments illustrated in the several figures of the drawing.

IN THE DRAWINGS

Figure 10:
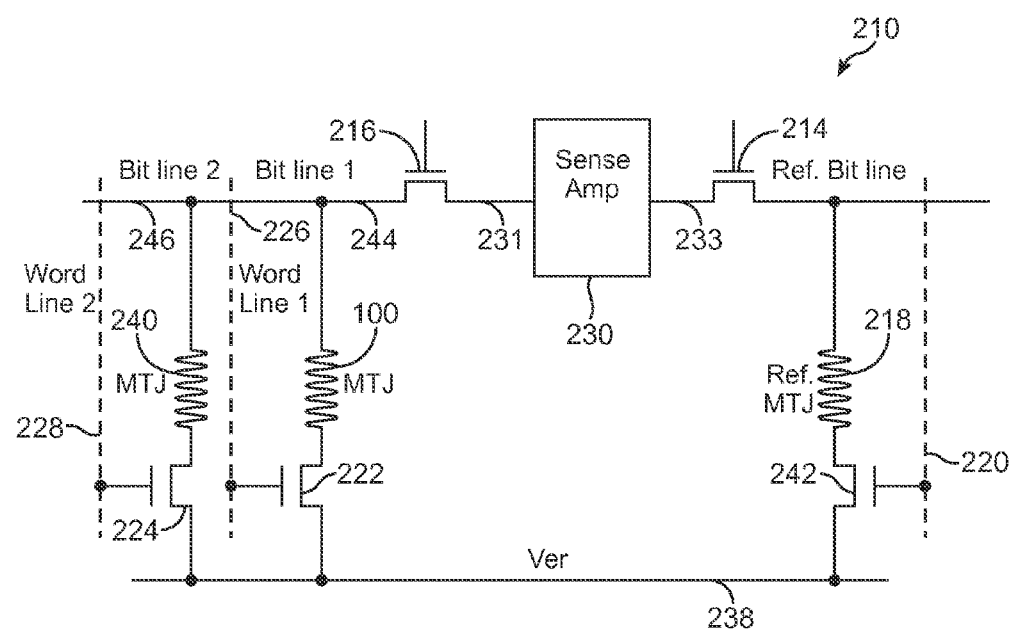

FIG. 10 shows a sensing circuit 210 including the memory element 100 for sensing or measuring the state of (reading) the memory element 100, in accordance with an embodiment of the present invention.

Figure 11:
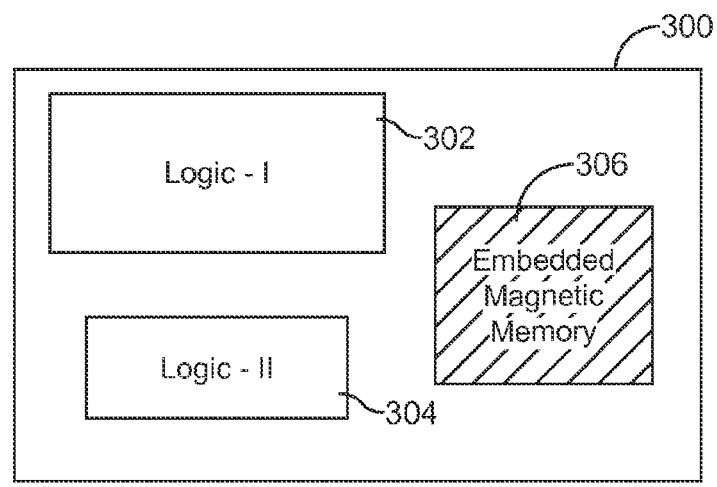

FIG. 11 shows a non-volatile memory integrated circuit 300 showing an application of the memory element 10 of the foregoing embodiments.

Figure 12:
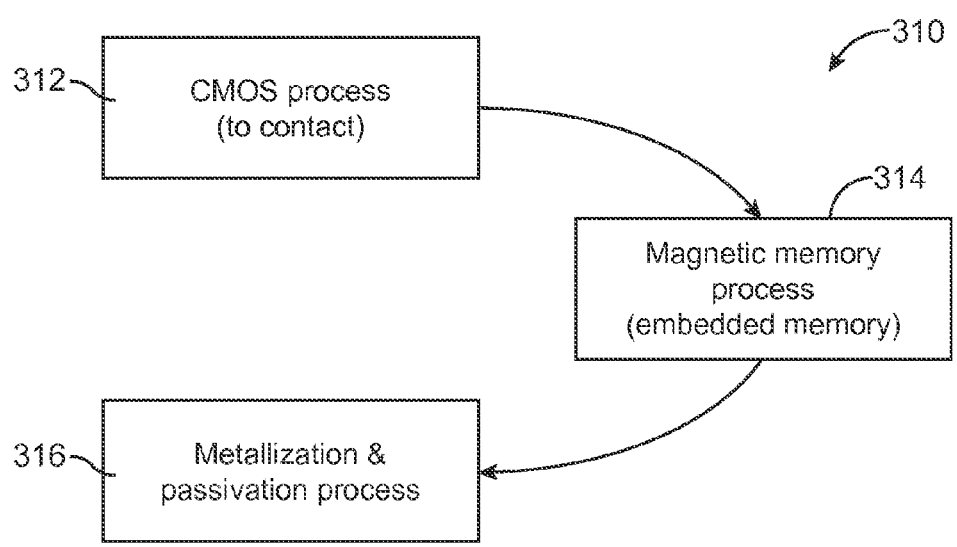

FIG. 12 shows a process flow chart 310 showing the steps performed in manufacturing the memory element 10 and corresponding CMOS circuitry.

Figure 13:
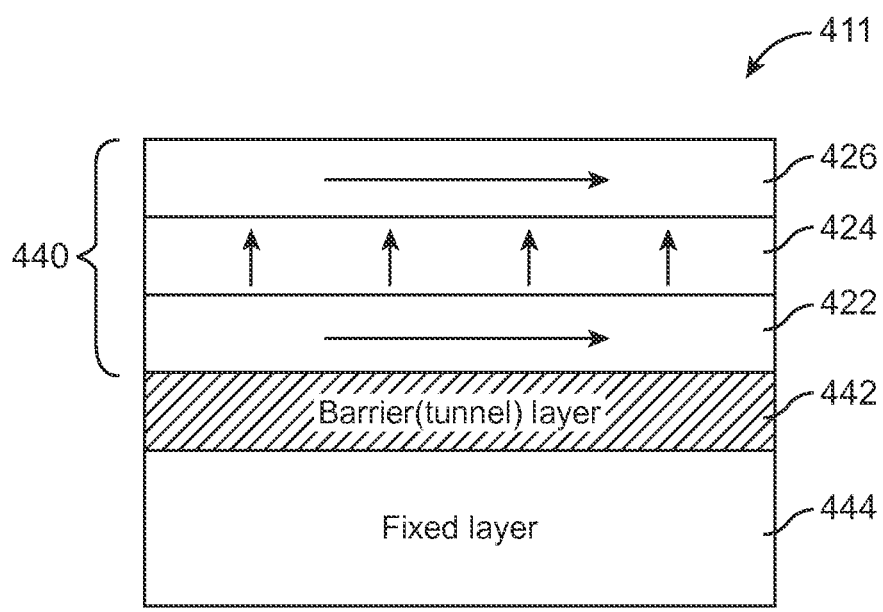

FIG. 13 shows the graded free layer 26 having out-of-plane magnetic anisotropy, in accordance with another embodiment of the present invention.

Figure 14:
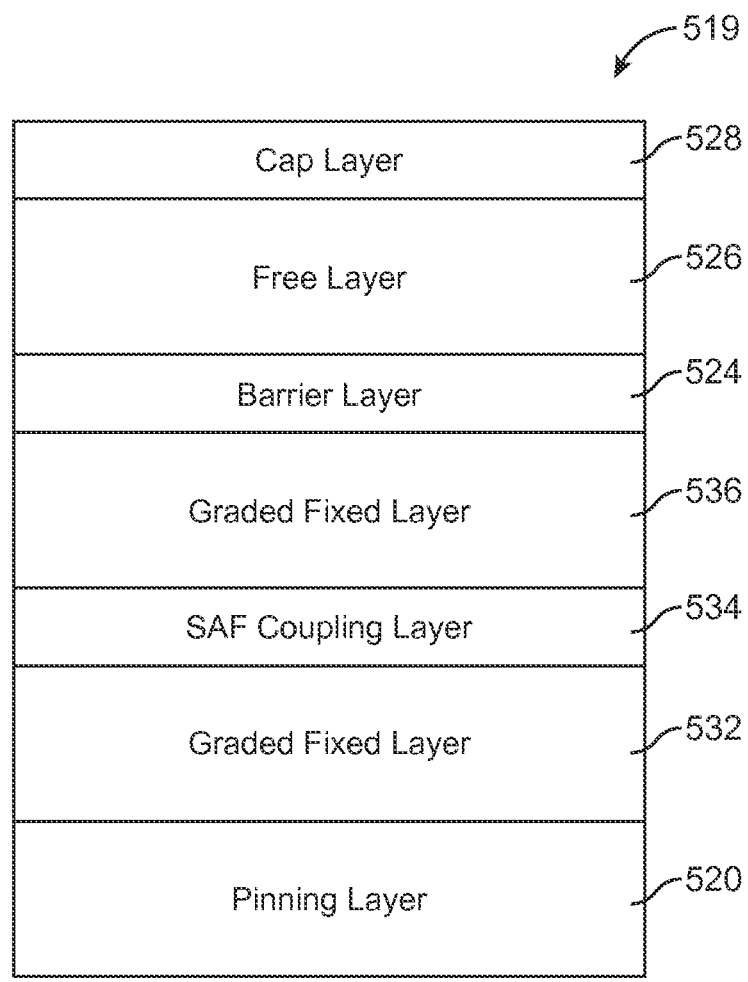

FIG. 14 shows a non-volatile magnetic memory element 519, in accordance with another embodiment of the present invention.

DETAILED DESCRIPTION OF THE PREFERRED EMBODIMENT

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention. It should be noted that the figures discussed herein are not drawn to scale and thicknesses of lines are not indicative of actual sizes.

In an embodiment of the present invention, a non-volatile magnetic memory element is disclosed. In one embodiment of the present invention, the memory element includes a graded fixed layer, a tunnel layer and a graded free layer, the fixed layer, tunneling layer and free layer comprising a magnetic tunnel junction (MTJ). The memory element is stackable into arrays of memory elements.

Figure 1:
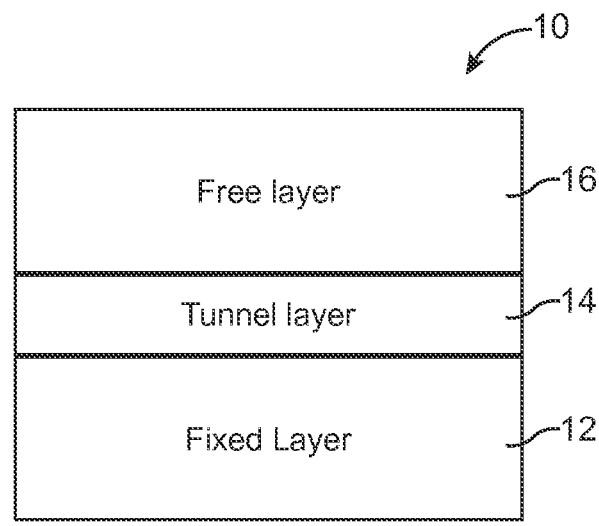
FIG. 1 shows relevant layers of a non-volatile magnetic memory element 10, in accordance with an embodiment of the present invention.

Referring now to FIG. 1, relevant layers of a non-volatile magnetic memory element 10 is shown, in accordance with an embodiment of the present invention. The memory element 10 is shown to include a fixed layer 12 on top of which is shown formed a tunnel layer 14 on top of which is shown formed a graded free layer 16. It should be noted that the drawings and figures shown herein are not drawn to scale. It should be noted that while throughout the following discussion and illustrations, the layer 16 or other free layers will be discussed as graded, the layer 12 may also be graded, in an alternative embodiment. Still alternatively, both layers 16 and 12 may be graded layers.

Figure 2:
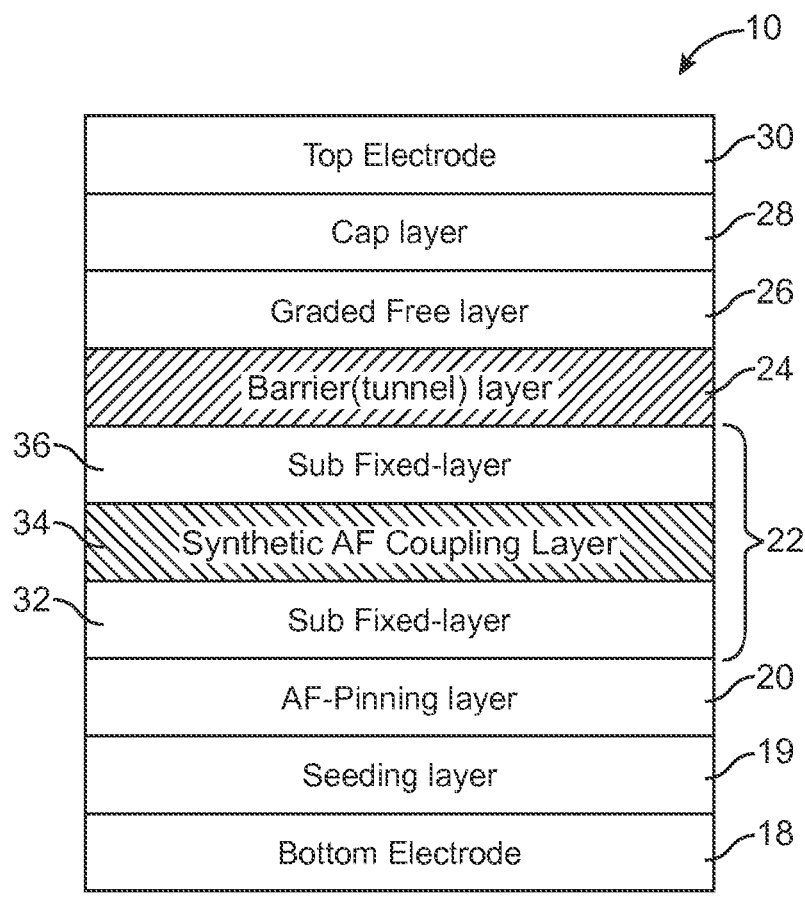
FIG. 2 shows further details of the layers of the memory element 10 of FIG. 1.

FIG. 2 shows further details of the layers of the memory element 10 of FIG. 1. In FIG. 2, an anti-ferromagnetic pinning layer 20 formed on top of a seeding (or seed) layer 19, which is shown formed on top of a bottom electrode 18 on top of which is shown formed a fixed layer 22 on top of which is shown formed a tunnel layer 24 on top of which is shown formed a graded free layer 26 on top of which is shown formed a cap layer 28 on top of which is shown formed a top electrode 30. The fixed layer 22 is similar to the layer 12 and the tunnel layer, which is synonymously referred to as a barrier layer, is similar to the tunnel layer 14 and the free layer 26 is similar to the free layer 16. The fixed layer 22 is shown to include a sub fixed layer 32 on top of which is shown formed a synthetic anti-ferromagnetic (AF) coupling layer 34 on top of which is formed a sub fixed layer 36.

During deposition of the free layer 26, the deposition process is varied during the deposition of the layer causing grading of the free layer 26, as will be shortly further discussed. Alternatively, the layer 22 may be a graded layer, in which case it is built in a manner similar to that of building or forming the layer 26, as further discussed below. A graded layer, such as the layer 26, is formed during the deposition process by varying the amount of oxygen or other reactive gas components in the sputtering gas, by varying the total sputtering gas pressure, by varying the substrate bias applied to the wafer, by varying the sputtering power applied to the target, by varying the ratio of sputtering powers to two or more targets during co-deposition, by bombarding the growing film with ions from a separate ion source or a combination of one or more of the foregoing. An exemplary sputtering gas is Argon, another example is xenon (Xe), krypton (Kr) or any other type of inert gases.

In an exemplary deposition method, gas pressure is varied monotonically, i.e. increasingly, from 0.5 to 10 milliTorr (mTorr) during deposition of the graded layer(s) which results in a gradual changing of the composition of the graded layer (s) as well as microstructure change. Monotonically refers to changing the gas pressure in an increasing direction over time.

In a yet another example, the target power density during sputtering is varied in a monotonic (increasing) manner from 0.1 to 1.0 Watts per centimeter squared (W/cm2) during the deposition of the graded layers to account for various target sizes. Target (or cathode) is the source of the material that is sputtered (or any other type of physical or chemical wafer deposition) onto the wafer or substrate.

In yet another case, two different targets are employed and the graded layer is made by co-deposition from the two different targets, the power density in one target is caused to be ramped up monotonically from 0.1 W/cm2 to 1 W/cm2 while the power density of the other target is ramped down from 1 W/cm2 to 0.1 W/cm2 which results in a gradually-changing composition through the film thickness of the graded layer.

In the foregoing examples using targets, alternatively, a negative voltage is applied to the wafer to enhance the bombardment of sputtering gas during deposition resulting in a changing composition and microstructure of the graded layer. Typical voltages range from −50 to −100 Volts. Substrate or wafer includes a number of memory cells. Alternatively, a radio frequency (RF)-based voltage may be employed.

In still another example, a separate ion source is employed to enhance the bombardment of sputtering gas during deposition resulting in a changing composition and microstructure of the graded layer. While this advantageously allows changing the ion source location and thereby the energy of the bombarded ions, it is more costly.

In one embodiment of the present invention, the tunnel layer 24 is made of titanium dioxide ($TiO_2$), alumina ($Al_2O_3$), magnesium oxide (MgO), tantalum oxide ($Ta_2O_5$), hafnium oxide ($HfO_2$), zirconium oxide ($ZrO_2$), tantalum nitride (TaN), strontium oxide (SrO), ruthenium oxide (RuO), or zinc oxide (ZnO). MgO, containing less than 50 mol % of the compounds from the foregoing list of components, is well suited to form the tunnel layer 24.

The layer 28 serves to insulate the layer 26 from the top electrode 30 and in this manner, serves to isolate the layer 26 from any micro-structural effects of the top electrode 30. The choice of material from which the top electrode 30 is made depends, at least in part, on the choice and availability of the etching process which is employed to define the size of the memory element 10. There are a number of choices of etching processes, such as, reactive etching process and ion-beam etching process. Reactive etching process is better suited for production and may employ different gases depending on the material from which the top electrode 30 is made.

In one embodiment of the present invention, the cap layer 28 is made of material selected from a group of amorphous materials such as nickel niobium (NiNb), nickel zirconium (NiZr), nickel niobium zirconium (NiNbZr), nickel silicon niobium (NiSiNb), or nickel silicon zirconium (NiSiZr). In yet another embodiment of the present invention, the cap layer comprises more than one layer including another layer chosen from tantalum (Ta), tantalum nitride (TaN), titanium (Ti), titanium nitride (TiN), copper (Cu), gold (Au) and ruthenium (Ru). A typical thickness of the layer 28 is less than 50 nm.

In one embodiment of the present invention, the bottom electrode 18 is made of a non-magnetic layer, such as, for example, tantalum (Ta) and using reactive ion etching (RIE) process. The seeding layer 19 which is formed on top of the layer 18 has the purpose to promote proper polycrystalline growth of the layer 20, has large enough conductivity and at the same time acts as a smoothening layer to ensure low surface roughness for the subsequent layers (formed thereatop) leading to a low surface roughness of the layer 24. Exemplary material forming the seeding layer 19 are Ta, Ru—X or NiFeY, where X and Y include one or more of the elements from the following group: chromium (Cr), molybdenum (Mo), tantalum (Ta), tungsten (W), zirconium (Zr), rhodium (Rh) or iridium (Ir). The seeding layer 19 serves to achieve proper crystalline orientation of the layer 20. The layer 20 is an AF magnetic layer that essentially determines the direction of magnetization of the layer 22.

In one embodiment of the present invention, the layer 34 is made of an alloy made of ruthenium (Ru) and element X which may include one or more of the elements from the following group: chromium (Cr), molybdenum (Mo), tantalum (Ta), rhodium (Rh) or iridium (Ir) which creates RKKY coupling between the adjacent magnetic layers namely, the layers 32 and 36. The choice of thickness of the layer 34 results in a parallel or anti-parallel magnetization across the magnetic layers 32 and 36. For example, typically a thickness of 6 Å to 10 Å results in a strong anti-parallel coupling between the two adjacent magnetic layers while a thickness of 12 Å to 18 Å results in parallel coupling.

The choice of alloy for layers 32 and 36 is one or many ferromagnetic elements, such as Co, Fe and Ni, and contains less than 20 atomic percent of platinum (Pt) and further contains up to 20 atomic percent of one or more of the following elements: P, B, Cr, Ta, W, Mo, Zr, Hf. The layer 36 is a substantially amorphous alloy, such as a CoFeCrB, where the boron, B, content of the alloy is typically in the range of 10 to 30 atomic percent which makes the as-sputtered layer amorphous. In a subsequent heating process, the layer 36 in conjunction with the layer 26, which is also amorphous in its as-deposited state, transform into a cubic crystal structure having (002) plane that is substantially parallel to the layer 24, which has a cubic crystalline structure being (001), and having their crystal planes, (001), matched. In the FIG. 2, the layer 24 is substantially parallel to the horizontal lines and in a direction going into the plane of FIG. 2. Following the annealing process, the atomic planes of the layers 26 and 36 transform into crystalline phase with their (002) crystal planes being horizontal and going into the plane of the FIG. 2. This type of structure results in the memory element 10 having a very high TMR (tunneling magneto-resistance).

Figure 7:
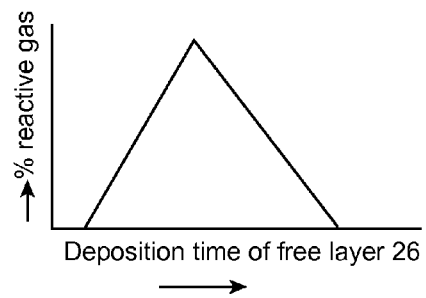
FIG. 7 shows a graphical representation of the percentage of reactive gas, shown by the x-axis, applied during deposition of the layer 26 vs. the deposition time, shown in the x-axis, of any of the graded layers.

Gases are introduced during the deposition of the layer 26, and in an exemplary embodiment and manufacturing method of the present invention, such gases are made of argon (Ar—X), xenon (Xe—X) or krypton (Kr—X), where X is typically less than 50 vol % of one or more of the following material: oxygen gas ($O_2$), water ($H_2O$), nitrous oxide ($NO_2$), nitric oxide (NO), sulfur dioxide ($SO_2$), carbon monoxide (CO), carbon dioxide ($CO_2$), or phosphine ($PH_3$), phosphorous pentaoxide ($P_2O_5$). Examples of the increase in the percentage of these gases during the processing time of deposition of layer 26 are shown in FIG. 7. In one embodiment, the percentage of reactive gas in the sputtering (or carrier) gas is less than 20 vol % of the total gas with the remainder of the reactive gas making up the rest of the total gas. Examples of the material comprising the less than 20 vol % include $H_2O$, $CO_2$, CO, NO or $NO_2$. Examples of material comprising the remainder of the total gas include argon, xenon or krypton.

In an exemplary embodiment, the layers 32 and 36 are compounds of Co, Fe and may contain nickel (Ni) as well as one or many elements from the following list of elements: boron (B), phosphorous (P), chromium (Cr), tantalum (Ta), zirconium (Zr), silicon (Si), molybdenum (Mo), hafnium (Hf), or tungsten (W). In one embodiment of the present invention, the layer 20 is made of iridium manganese (IrMn), platinum manganese (PtMn) or nickel manganese (NiMn) containing one or more of the elements from the list: chromium (Cr), nickel (Ni), or molybdenum (Mo).

In an exemplary embodiment, the layer 26 is made of ferromagnetic material and the layer 28 is made of nonmagnetic material and the top electrode 30 is made of nonmagnetic material. An example of the ferromagnetic material used to make the layer 26 is $(CoFe)1-xBx$ where x is atomic fraction of B within the alloy composition and is typically less than 0.4. In an exemplary embodiment, the layer 36 is ferromagnetic in characteristic as is the layer 32 and the layer 32 is made of the ferromagnetic material (CoFe)1-yBy where y is atomic fraction of B within the alloy composition and is typically is less than 0.4 and the layer 36 is made of the ferromagnetic material (CoFe)1-xBx.

The bottom layer 18 which is formed below the layer 20 has multiple purposes based on the process sequence. The bottom layer 18 acts as the bottom electrode for the magnetic memory and typically consists of more than one layer. This layer need have large enough conductivity and at the same time acts as a smoothening layer to ensure low surface roughness for the subsequent layers leading to a low roughness of the layer 24. This is required in order to obtain a high tunneling-magneto-resistance (TMR) ratio. In one embodiment, the bottom layer 18 comprises of multiple bi-layers of aluminum (Al) and copper (Cu) each having a thickness of less than 20 nm. In a yet another embodiment, a tantalum (Ta) layer is included having a thickness of less than 50 nm.

Typical thicknesses of the various layers shown in FIG. 2 are as follows: the bottom layer 18 is less than 100 nanometers (nm), the seeding layer 19 is less than 20 nm, the layer 20 is less than 20 nm, the layer 32 is less than 10 nm, the layer 34 is less than 3 nm, layer 36 is less than 10 nm, the layer 24 is less than 3 nm, the layer 26 is less than 20 nm, the layer 28 is less than 50 nm and the top electrode 30 is less than 100 nm. In one embodiment of the present invention, the bottom electrode 18 is 50 nm, the layer 20 is 9 nm, the layer 32 is 4 nm, the layer 34 is 1.2 nm, the layer 36 is 3 nm, the layer 24 is 1.2 nm, the layer 26 is 4 nm, the layer 28 is 10 nm and the top electrode 30 is 40 nm, in size.

In operation, current is applied to the element 10 in a direction, for example, parallel to the page and from the bottom electrode 18 to the top electrode 30. A current switching effect arises from the interaction between magnetic moments and the transport current. At least two dominant mechanisms are employed, namely, current induced magnetic field and spin-torque from the current induced spin polarization. In addition, there is also an effect from spin-accumulation at the interface of layer 26 due to the discontinuous Fermi-level, which could also assist in the switching of the layer 26 when appropriate current is applied such as a switching current of less than 500 micro-amps for an elongated memory element having a dimension of less than 100 nm-by-200 nm and having an aspect ratio (=long axis/short axis) of between 1.2 to 3.

While the current-induced effect through the magnetic field is directly proportional to the radius r, the latter spin-torque effect is proportional to $r^2$, where r is the distance from the current carrying electrode to the layer 26. Torque is generated by spins through the momentum transfer of tunneled spin-polarized conduction electrons from the layer 22, which opposes the "intrinsic" damping of spins of the layer 26. At sufficient current, such as between 200 micro amps (μA) to 300 μA for a memory element of dimension between 100 nm-by-200 nm to 80 nm-by-160 nm having a relatively oval shape along the y-axis. This can reverse the direction of the magnetization in the layer 26. A rough estimate of the critical current required for such switching is generally calculated in accordance with the following equation:

$$Ic=IC_0[1-(k_B T/K_u V)\ln(t_p/t_0)]$$  Eq. (1)

Where $IC_0$ is the critical switching current density without thermal fluctuation; $k_B$ is the Boltzmann constant; T is the temperature; $K_u$ is the effective uniaxial anisotropy and V is the volume of the free-layer; $t_0$ is the inverse of the procession frequency of the spin (less than 1 ns); $t_p$ is the pulse width of the switching current.

One way to reduce the critical switching is by reducing either $K_u$ or V of the free layer 26. Additionally, the switching current can be reduced by lowering the thickness of the free layer 26, which may, however, compromise the reliability of the memory element 10 by making the size thereof more thermally unstable. Generally, a memory element with the free layer having higher $K_u$ V is more thermally stable at higher temperatures. As a general rule, the magnetic energy, $K_u$ V, of the free layer be greater than approximately 60 $k_B T$ where, $k_B$ is the Boltzmann constant and T is the ambient temperature.

The embodiments of the present invention relies on the physics that the magnetization reversal takes place in a nanoseconds time scale, and on the relative strengths of intergranular exchange coupling and magneto-static coupling between the neighboring grains. The exchange coupling is generally much stronger than the magneto-static coupling. This could lead to different values of "V" corresponding to the switching volume and the volume responsible for keeping the thermal stability. More specifically, in the embodiments of the present invention, the switching volume remains small while keeping the "volume" responsible for thermal stability large. This advantageously results in a lower "writing" or "programming" current while maintaining higher thermal stability.

One of the steps for manufacturing the memory element 10 is the magnetic annealing process where the magnetic films are exposed to a magnetic field of 4-10 kOe applied in-plane of the wafer surface at a temperature of typically over 350C. In one embodiment, a magnetic field of 5 kOe is applied parallel along the long, or easy, axis (for example an axis that is parallel to the 150 nm axis for a 100 nm-by-150 nm memory cell) of the memory element 10 and parallel to the wafer surface at a temperature of 375 degrees Celsius (C) for 2 hours. The role of the application of the magnetic field is to set the magnetic-orientation of the layer 20. At the same time, temperature annealing causes crystallization in the adjacent layers of layer 24, such as the layer 26 and the layer 36. This helps in ensuring high tunneling magneto-resistance (TMR), which is related to the ratio of resistance of two states which has a direct impact on the read-speed of the final memory. The foregoing description of the operation/manufacturing process is intended to describe an exemplary embodiment thereof, thus, other ways of achieving the same results are anticipated.

In FIG. 2, the fixed layer 22 is shown to include a sub fixed layer 32 on top of which is shown formed a synthetic anti-ferromagnetic (AF) coupling layer 34 on top of which is formed a sub fixed layer 36. In an alternative embodiment, the layer 22 of FIG. 2 is graded, in the same manner as described relative to the layer 26. In such an embodiment, only the sub fixed layers, such as the layers 36 and 32 of FIG. 2 are graded.

In yet another embodiment of the present invention, both the free layer 26 and the fixed layer 22 are graded, having changing composition through the film thickness to ensure enhanced crystallization of the free and fixed layers for high TMR as well as low switching current. In such an embodiment, the boron, B, content of the CoFeB alloy is varied through the film thickness of both the graded fixed and free layers in such a manner that the composition of the fixed and free layer adjacent to the barrier layer is closer to 10 atomic percent and increases to more than 20 atomic percent at the other interface of both the fixed and free layers. In a yet another example, the fixed layer and the free-layer have the composition of CoFeZrPtB where the B content is varied in a similar manner for both the free and the fixed layers. The mechanism for such graded approach is that the atomic layers closer to the barrier layer tend to crystallize at lower temperature first and thereby initiate the crystallization for the rest of the atomic layers. In the preferred modes, there is a gradual variation of boron which creates a gradual driving force for crystallization from the barrier layer to the rest of the film. This results in a better transformation of the amorphous layers resulting in more coherent tunneling channels and thereby leading to higher TMR. It is expected that such structure will also have lower switching current characteristic.

Figure 2A:
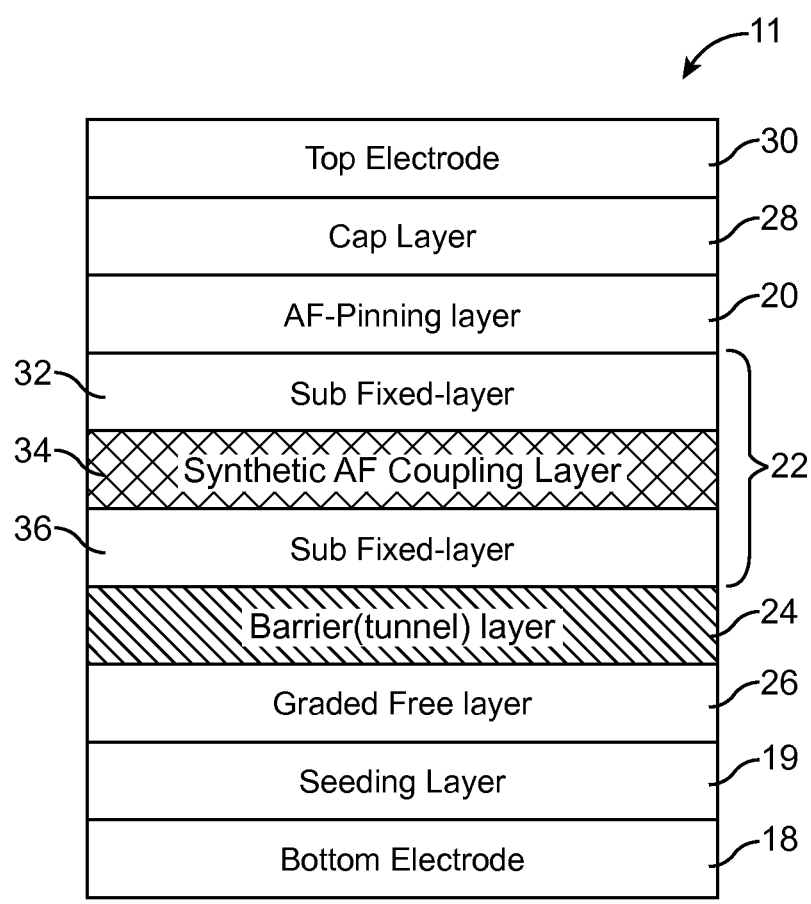
FIG. 2(a) shows a non-volatile magnetic memory element 11, in accordance with an alternative embodiment of the present invention.

FIG. 2(a) shows a non-volatile magnetic memory element 11, in accordance with an alternative embodiment of the present invention. The memory element 11 is shown to include the same layers as that of the embodiment of FIG. 2 except that some of the layers are formed in different orders. In FIG. 2(a), the memory element 11 is shown to include the bottom electrode 18 on top of which is shown formed a seeding layer 19 on top of which is formed the graded free layer 26. On top of the layer 26 is shown formed the barrier layer 24 on top of which is shown formed the fixed layer 22 on top of which is shown formed the pinning layer 20. On top of the layer 20 is shown formed the cap layer 28 and on top of the cap layer 28 is shown formed the top electrode. The layer 22 is formed of multiple layers, as shown and described relative to FIG. 2.

In FIG. 2(a), the sub fixed layer 36 is formed on top of the layer 24 and the layer 20 is shown formed on top of the layer 32.

In alternative embodiments, any of the layers of the memory element 10 are graded. Still alternatively, any combination of the layers of the memory element 10 are graded.

Figure 3:
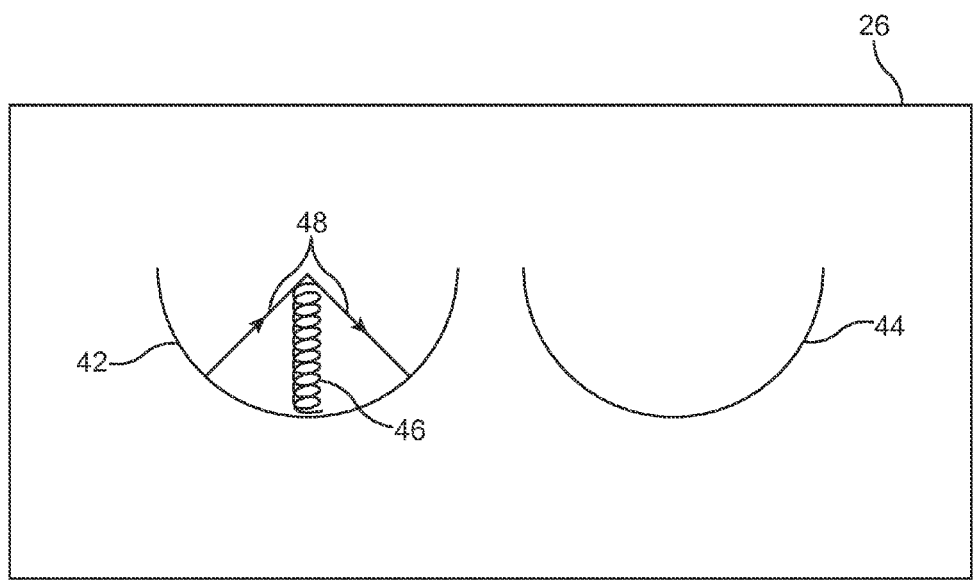
FIG. 3 shows states of the layer 26 as the memory element 10 is programmed.

FIG. 3 shows states of the layer 26 as the memory element 10 is programmed. In FIG. 3, the physical alterations of the layer 26 lead to the switching from one state to another of the memory element 10 and therefore programmability or erasure thereof.

In FIG. 3, the layer 26 is shown to include two areas 44 and 42 where enhanced switching of magnetic moment starts and builds up as a result of the graded characteristic of the layer 26 thereby resulting in lower switching current density. A "graded" layer is a layer whose material characteristics exhibit different properties such as the magnitude and the direction of magnetic anisotropy vector thereof, composition or microstructure. Other examples of properties include magnetic moments, electrical conductivity, magneto-striction, or other magnetic or electrical properties.

As the conduction electron carrying parallelizing spin enters from the bottom, i.e. the bottom electrode 18 for parallelizing process or reflected anti-parallel for anti-parallelizing process, the layer 26 is graded, that is, non-uniform switching of the layer 26 is initiated and builds up to ultimately switch the state of the memory element 10, from, for example, parallel to anti-parallel to visa versa. Such build up is shown at 46 and the switching occurs with the direction of the state in the direction shown by the arrows 48 of FIG. 3.

The embodiments of FIGS. 1-3 show a current-switching non-volatile MRAM which requires lower switching current and is scaleable to lower lithographic dimensions. The free layer thereof includes oxides, nitrides, sulphides or phosphides based on the selection of gas introduced during manufacturing. The content of the foregoing is substantially non-magnetic compounds varying across the thickness of the free layer 26, which results in a film having "graded" contents of the oxides or the nitrides or the like. These films accentuate the non-uniform switching process during the current-induced switching of the memory element 10 thereby leading to a low programming or erase currents.

Figure 4:
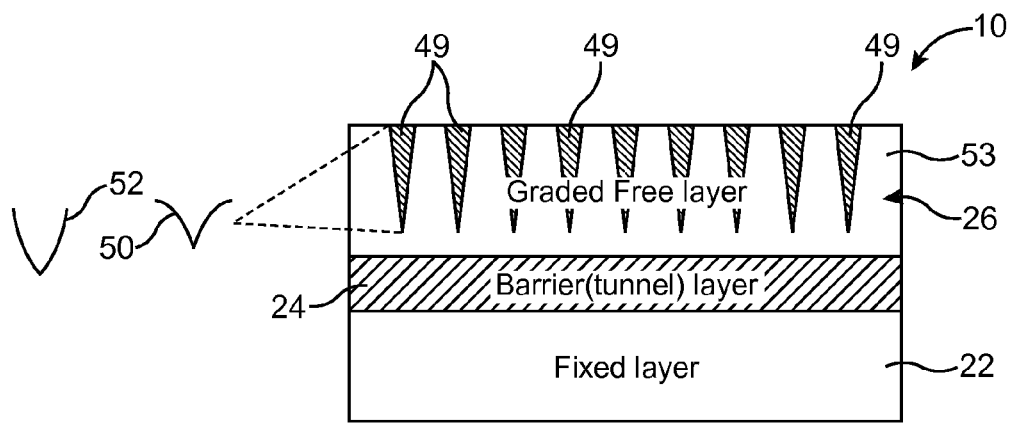
FIG. 4 shows certain portions of an exemplary embodiment of the memory element 10.

FIG. 4 shows certain portions of an exemplary embodiment of the memory element 10. In FIG. 4, the layer 22 is shown on top of which is shown formed the tunnel (or barrier) layer 24 on top of which is shown the layer 26. The layer 26 is shown to include a region 48 having a substantially larger content of the aforementioned non-magnetic compounds, shown to be formed in the shape of an upside down cone although other shapes are anticipated such as, but not limited to, the shapes shown at 50 and 52. The regions 49 are generally non-conductive and may be either completely non-magnetic or partly magnetic depending on the base alloy employed.

The more reactive the compound, the thicker the size of the region 49 across. The thickness of each of the region 49 is determined by the following equation:

$$\text{Power} \times \text{time} \; \alpha \; \text{size of region 49} \qquad \text{Eq. (2)}$$

The length, in the vertical direction, of each of the region 49 is a function of time. That is, the duration of time during which oxidization (nitridation or the like) occurs determines the vertical length of the region 49. The regions 49 are made of oxides, nitrides or other material previously noted. Since nitrous oxide ($NO_2$) is not as reactive as CO or $O_2$, it is advantageously used to form the compound in 49 from a process or manufacturing perspective. The regions 49 are essentially each increasing the amount of oxide formed from increasing amounts of the reactive gases.

In FIG. 4, magnetic regions (not including the region 49) 53 make up the remainder of the layer 26. Momentum transfer builds up to a critical size until an avalanche reversal occurs, switching the state of the memory element 10. In the embodiments of FIGS. 1-4, spin polarized electrons would not be conducted through their areas and will be concentrated in substantially magnetic regions, thereby initiating "localized" switching leading to an avalanche type of switching. For example, if the base alloy used is CoFe and an oxidizing gas is used such as $H_2O$, $NO_2$, then the regions 49 are comprised of mostly oxidized compounds of Co and Fe, such as CoO, $Co_2O_3$, FeO, $Fe_2O_3$ being in a mixture. If the base alloy includes Cr, Ta, Mo, W or Ti, then the oxides are of the types such as $Cr_2O_3$, CrO, $Ta_2O_5$, TaO, MoO, $Mo_2O_3$, $W_2O_3$, Wo, $TiO_2$ or TiOx.

Figure 5:
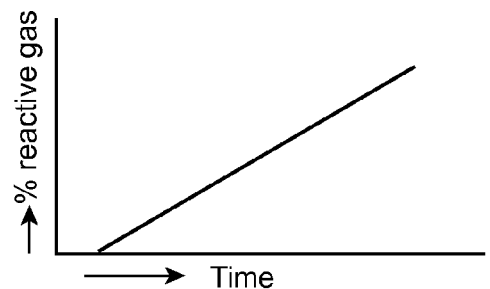
FIG. 5 shows a graphical representation of the amount of reactive gas applied as a function of time during deposition of any of the graded layers.

FIG. 5 shows a graphical representation of the amount of reactive gas applied as a function of time during deposition of any of the graded layers. FIG. 5 shows a graphical representation of the amount of reactive gas content in the carrier gas, such as argon (Ar), applied during deposition of the free layer 26. The y-axis shows the percentage of the reactive in gas and the x-axis shows time.

Figure 6:
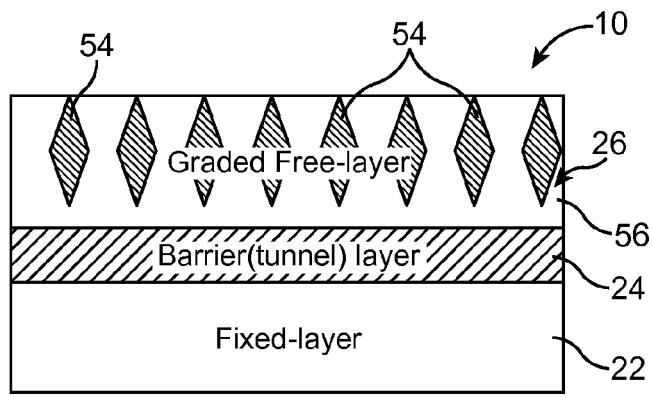
FIG. 6 shows certain portions of the memory element 10 in accordance with another embodiment of the present invention.

FIG. 6 shows certain portions of the memory element 10 in accordance with another embodiment of the present invention. In FIG. 6, the layer 26 is shown to include oxides 54 made of, for example, Co and Fe. The oxides 54 are generally non-magnetic or magnetic oxides. While the shape of the oxides 54 appear as diamonds, other shaped-oxides may be formed, such as, but not limited to, oval or curved diamond. The diamond-shaped oxides 54 versus the oxides 53, are known to lower the switching and programming current of the memory element 10 due to their shape. Magnetic regions 56 make up the remainder of the layer 26.

FIG. 7 shows a graphical representation of the percentage of reactive gas, shown by the x-axis, applied during deposition of the layer 26 vs. the deposition time, shown in the x-axis, of any of the graded layers. In one embodiment, the reactive gas is Ar-5% $NO_2$ is premixed with the primary gas Ar. The second gas Ar-5% $NO_2$ is introduced after 1 second of starting the deposition of layer 26 and is increased to 20% of the total gas at 5 seconds from start and is dropped to zero after 9 seconds while the total deposition time of layer 26 is 10 seconds.

Figure 8A:
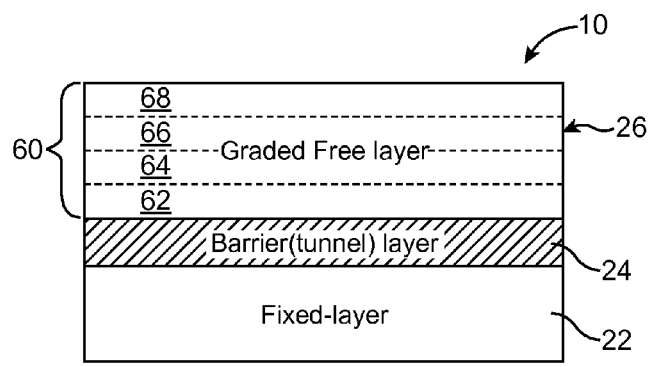
FIG. 8(a) shows certain layers of the memory element 10 in accordance with yet another embodiment of the preset invention.

FIG. 8(a) shows certain layers of the memory element 10 in accordance with yet another embodiment of the preset invention. In FIG. 8(a), the tunnel layer 24 is shown formed on top of the fixed layer 22 and on top of the tunnel layer 24 is shown formed the graded free layer 26, as in previous embodiments. However, the layer 26 includes multiple elements 60 rather than the single element, such as CoFeB, of previous embodiments. The multiple elements 60 are shown to include the elements 62-68 although other number of elements may be employed.

The elements 60, in an exemplary embodiment, are made of $(CoFe)1-xBx$ wherein x, in the case where the elements are non-magnetic, is chromium(Cr), tantalaum (Ta), tungsten (W), titanium (Ti), zirconium (Zr) or hafnium (Hf), which tend to oxide fast, whereas in the case where the elements are magnetic, x is typically less than 20 atomic percent. Most of the momentum transfer starts at the element 62 and in the embodiments of the present invention, the build up of and effective use of moment transfer lowers current.

The element 62 generally exhibits a characteristic that is high in Ku or anisotropy, high in Co, for example, Co (70%) and Fe (30%), whereas the element 64 exhibits mid Ku and the element 66 exhibits low Ku, for example Co (30%) and Fe (70%).

In a yet another embodiment the Co/Fe ratio is changed from 0.8 to 1.2 with 1 being Co(50 at %)Fe(50 at %). The composition gradient can be made through a number of processing approaches. For example, it can be made through using a multiple target system where each element has its own power control which is varied separately to mix in the plasma. In a yet another approach, the gas flow, target power or the bias during sputtering is varied to make different composition of the film through the thickness. A yet another approach may involve using a separate ion-gun to generate elemental ions which are impinged on the growing film of layer 26 or layer 22 or both.

Figure 8C:
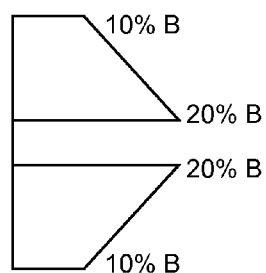
FIG. 8(c) shows the composition profile in the graded layers in accordance with yet another embodiment of the preset invention.
Figure 8B:
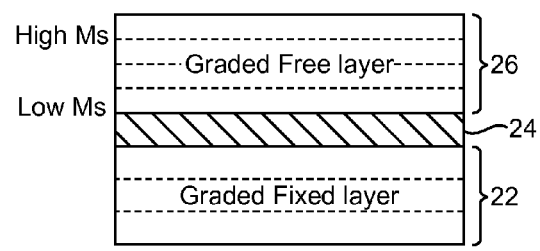
FIG. 8(b) shows certain layers of the memory element 10 in accordance with yet another embodiment of the preset invention.

FIG. 8(b) shows yet another embodiment where the layers 22 and 26 are both graded in such a manner that the composition of boron, B, is varied through the thickness. An example of percent boron through the film is shown in FIG. 8(c) where higher boron content is shown adjacent to the layer 24 and the percent of boron drops away from the layer 24. In one embodiment, the percent of boron is 20 atomic percent adjacent to the layer 24 and drops down to 10 atomic percent at the edge of layers 22 and 26.

Figure 9:
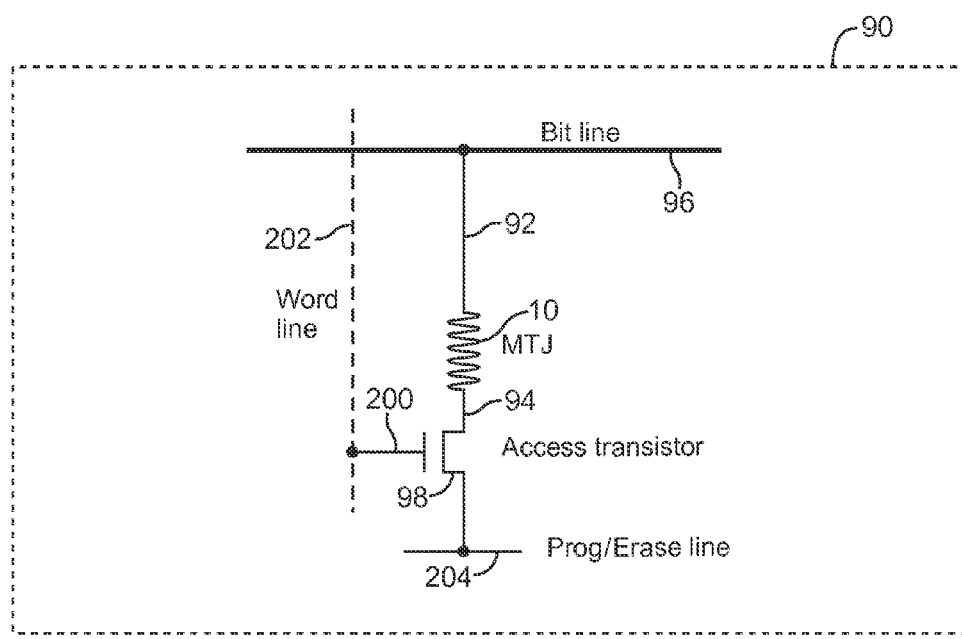
FIG. 9 shows a magnetic tunnel junction, such as in the memory element 10 with an access transistor, in accordance with an embodiment of the present invention.

FIG. 9 shows a magnetic tunnel junction (MTJ), such as the memory element 10 with an access transistor, in accordance with an embodiment of the present invention, forming a memory cell 90. In FIG. 9, the memory element 10 is shown coupled, through an electrode 92, to a bit line 96, on one of its ends, which is typically the top electrode 30. On the other end, the memory element 10 is shown connected, through a bottom electrode (BE) 94 (such as the bottom electrode 18 of FIG. 2), through a contact, which is also shown coupled to a drain of a transistor 98. The transistor 98 further includes a source shown coupled to the program/erase line 204. The gate 200 of the transistor 94 is shown coupled to a word line 202. The electrode 92 is made of conductive material.

The embodiment of the FIG. 9 may be referred to as a single or 1-cell architecture. The MTJ (magnetic tunnel junction also referred to as the memory element 10) acts as the non-volatile memory element. The MTJ element has low resistance in the programmed state and higher resistance in the erased state. For example, in one embodiment of the present invention, the resistance for the low state is at least half of that of the high state. Low and high refer to binary states of '1' and '0' or vice versa. MTJ element or the memory element 100 is shown to have one transistor in series with it for accessing the memory element. The bit line 96 is made of metal and the word line 202 is made of poly-silicon.

In operation, the memory element 10 is accessed in the following manner. The memory (or MTJ) element 10 in conjunction with the access transistor 98 forms a memory cell 90. To program the memory cell 90, the bit line 96 is connected to a positive power supply while the Program/Erase line 204 is connected to ground. By accessing the memory cell 90, the word line 202 is raised to a predetermined voltage, which turns the transistor 98 'on' and current flows from the bit line 96 to the Program/Erase line 204. Electrons flow in the opposite direction and travel through the fixed layer of the memory element 10 before entering the free layer. This causes the magnetic orientation of the free layer to align with the fix layer and the resistance (R) of the memory element 10 to be dropped to a minimum. The erase operation, on the other hand, is performed by changing the direction of the bit line and the program/erase line. This time the Program/Erase line is biased positive while the bit line is grounded. The current will flow from Program/Erase line to bit line, or electrons flow from bit line to Program/Erase line. Since the free and fix layers are magnetically aligned (programmed state), then minority electrons are reflected from the fix layer back into the free layer. These electrons have a spin orientation which is the opposite of the fix layer. When they are injected into the free layer, they apply a moment on the magnetic elements of the free layer in the opposite direction. By pushing enough electrons through eventually the magnetic orientation of the free layers change in the anti-parallel direction, and the MTJ resistance maximizes.

FIG. 10 shows a sensing circuit 210 including the memory element 100 for sensing or measuring the state of (reading) the memory element 100, in accordance with an embodiment of the present invention. In FIG. 10, the sensing circuit 210 is shown to include a sense amplifier circuit 212 coupled to a first decoding transistor 214 and further coupled to a second decoding transistor 216, at their source. The drain of the transistor 214 is shown coupled to a reference memory element (MTJ) 218 and serves as a reference bit line. MTJs are each made of the memory 100, in one embodiment of the present invention. The reference memory element 218 is further shown coupled to a transistor 242 at the drain of the transistor 242. The gate of the transistor 242 forms a reference word line 220 and the source of the transistor 242 forms the Ver (or erase voltage) 238, which is shown coupled to the source of the transistor 222.

The drain of the transistor 222 is shown coupled to the memory element 100 and an opposite end of the memory element 100 is shown coupled to the drain of the transistor 216 and forms the bit line 1 244. The erase voltage 238 is similarly shown coupled to the source of the transistor 224 and the gate of the transistor 224 is shown to form the word line 2 228. The drain of the transistor 224 is shown coupled to the memory element 240, which on an opposite end thereto, forms the bit line 2 246.

The read operation will now be explained with reference to FIG. 10. During a read operation, the sense amplifier circuit 210 compares the resistance of the memory element 100 of the selected cell to the resistance of the reference memory element 218. The resistance of the cell 218 is designed to be (R1+R2)/2, where R1 is the resistance of the memory element 100 in a low state and R2 is the resistance of the memory element 100 in high state. The high and low states are based on the description provided above where the low state has a characteristic of being at least half of the resistance of that of the high state. The magnetic orientation of the fixed and the free layers are parallel relative to each other at a low state and at a high state, the magnetic orientation of the fixed and free layers are anti-parallel relative to each other.

In one embodiment of the present invention, the sense amplifier 230 is a bi-stable latch or any such device, which flips between states based on the state of the resistance. For example, if resistance is low, the state will be that of a low state and if resistance is high, the state will be that of a high state.

It should be noted that the magnetic memory elements 100 and 240 are two of many magnetic memory elements coupled to bit line 244. The transistors 222 and 224 will select one of these magnetic memory elements based on the selection of one of the word lines 226 or 228. When a word line is selected, it is biased with the appropriate potential required to turn on the selected transistors. When one of the transistors 222 or 224 is selected, the memory element 100 is caused to be coupled to the circuit 230, at 231, through the transistor 216, which as a decoder circuit. At the same time the reference memory element 218 is selected by the transistor 242 and the word line 220. Thereafter, current flows through the selected transistors, i.e. transistor 222 or 224. The current flowing through the reference memory element 218 is always the same, while current flowing through the selected memory elements, such as the memory element 100 depends on the state of that memory element. That is, if the memory element's state is high, its associated resistance (R) is high with respect to the reference memory elements. Thereafter, less current flows through the selected memory elements than the reference memory element 218, causing the sense amplifier circuit 230, at 233, to enter a high state with respect to that of 233. On the other hand, if the selected memory element is at a low state and has low resistance, its current is high with respect to that of the reference memory element 218 and the voltage at 231 drops. In this manner, the voltage at 231 determines the state of the selected memory element.

FIG. 11 shows a non-volatile memory integrated circuit 300 showing an application of the memory element 10 of the foregoing embodiments. The circuit 300 is shown to include a logic I 302, a logic II 304 and embedded magnetic memory 306. The memory 306 includes an array of the memory elements of the foregoing embodiments of the present invention, such as the memory element 10. The logic 1302 and the logic II 304 are CMOS circuit used for addressing the memory 306.

FIG. 12 shows a process flow chart 310 showing the steps performed in manufacturing the memory element 10 and corresponding CMOS circuitry. In FIG. 12, at step 312, a CMOS process is performed to form the contacts and requisite CMOS circuits. Next, at step 314, the embedded memory or array of memory elements 10 is processed and finally, at step 316, metallization and passivation processes are performed. The oxidation step discussed herein form oxides forming the graded free layers shown and discussed with respect to various embodiments and is performed during the step 314.

In yet another embodiment of in the graded layer, such as the layer 26, the magnetic anisotropy direction in the layer is varied from in-plane to out-of-plane. This is accomplished by the graded free layer having a substantially perpendicular component, shown at 424 in FIG. 13. FIG. 13 shows the graded free layer 26 having out-of-plane magnetic anisotropy, in accordance with another embodiment of the present invention. This facilitates switching of the free layer by having a more effective application of the torque from the spins accompanying the conduction electron thereby leading to a lower switching current. More specifically, the spins accompanying the conduction electrons during the "parallelizing" process or the reflected spins in the "anti-parallelizing" direction tend to be substantially parallel to the in-plane direction for the longitudinal orientation. As these spins travel through the substantially perpendicular component 424 of the graded free layer 26, which has substantially perpendicular magnetic moments, they impart maximum torque thereby initiating the magnetic reversal. This, in turn, begins to pull the magnetizations vectors of the spins of the layers that are formed adjacent to the substantially perpendicular component, such as the layers 422 and 426, and eventually leads to a complete reversal in the free layer. The free layer, due to the preferred anisotropy from the "elongated" shape and the field-induced anisotropy along the long-axis, remains in two states namely, the parallel or anti-parallel state with the fixed layer magnetization.

In one embodiment of the present invention, the graded free layer has at least three portions namely, the portion closer to the "barrier" or tunneling layer, marked as layer 422, being an amorphous layer such as CoFeB, then a layer 424 comprised of multi-layer of cobalt (Co), platinum (Pt) and or palladium (Pd). There may be more than few alternating layer of these elements which are deposited sequentially typically using a multi-target sputtering source. In one example a three-layer, Co/Pt multi-layer, is used where the Co layer thickness is 0.2 to 0.6 nm and the Pt layer is 0.4 to 1.2 nm thick. In a another, example Pd/Co/Pt multi-layer is used where a the typical stack has 2-5 repeated layers and the Pd layer is 0.3 to 1.2 nm thick, Co-layer is 0.2 to 0.8 nm thick and the Pt-layer is 0.6 to 1.2 nm thick. Another layer-426 of CoFeB or just CoFe layer may be placed on the top. Layers 422, 424 and 426 are collectively referred to as the free-layer. The layer 422 is kept primarily amorphous as-deposited to ensure high tunneling-magneto-resistance (TMR) for the memory element after post-annealing. It should be pointed out that the TMR depends on the relative magnetic orientations of the magnetic moments on the two sides of the barrier layer namely, the fixed layer and the layer 422 of the free layer. A typical thickness of the layer 422 is 0.5 to 3 nm. The layer 424 role is to primarily reduce the switching current to ensure lower power for the memory products. The role of the layer 426 is to ensure firstly a high degree of polarization of the incoming conduction electrons from top during the "anti-parallelizing" process while providing enough magnetic energy for high enough thermal stability.

FIG. 14 shows a non-volatile magnetic memory element 519, in accordance with another embodiment of the present invention. In FIG. 14, the memory element 519 is shown to include a pinning layer 520 on top of which is shown formed a graded fixed layer 532, on top of which is shown formed a synthetic AF (SAF) coupling layer 534 on top of which is shown formed a graded fixed layer 536, on top of which is shown formed a barrier layer 524, on top of which is shown formed a free layer 526, on top of which is shown formed a cap layer 528. While not shown in FIG. 14, a bottom electrode is generally formed below the layer 520 and optionally, a seeding layer is formed between the bottom electrode and the layer 520. A top electrode, not shown in FIG. 14, is formed on top of the cap layer. Current is applied from the layer 520 through the top to the cap layer 528. The layers 532 and 536 are each graded fixed layers, which sandwich the layer 534.

During deposition of the layers 536 and 532, the deposition process is varied during the deposition of the layer causing grading of the layers 536 and 532 in a manner similar to that of building or forming the free layer, as further discussed above. The graded layers can be achieved during the deposition by varying the amount of oxygen or other reactive gas component in the sputtering gas, by varying the substrate bias applied to the wafer, by varying the sputtering power applied to the target, by varying the ratio of sputtering powers to two or more targets during co-deposition and by bombarding the growing film with ions from a separate ion source.

The choice of alloys for layers 536 and 532 is one or many ferromagnetic elements, such as Co, Fe and Ni, and contains less than 20 atomic percent of platinum (Pt) and further contains up to 20 atomic percent of one or more of the following elements: P, B, Cr, Ta, W, Mo, Zr, Hf. In one embodiment, the layer 536 is a substantially amorphous alloy, such as a CoFeCrB, where the boron, B, content of the alloy varies between 10 to 30 atomic percent in such a way to enhance crystallization of layer 536 starting from the barrier layer interface during a subsequent heating process, the layer 536 transforms into a cubic crystal structure having (002) plane that is substantially parallel to the barrier layer, which has a cubic crystalline structure being (001), and having their crystal planes, (001), matched. This type of structure results in the memory element having a very high TMR (tunneling magneto-resistance).

In another embodiment, the layer 532 is a substantially crystalline alloy, such as a CoFeCr, where magnetic moment of the alloy is varied in such a way as to enhance the exchange-coupling to anti-ferromagnetic layer 520 and enhance the RKKY coupling with layer 536 across the spacer layer 534. The layer 534 is made of an alloy made of ruthenium (Ru) and element X which may include one or more of the elements from the following group: chromium (Cr), molybdenum (Mo), tantalum (Ta), rhodium (Rh) or iridium (Ir) which creates RKKY coupling between the adjacent magnetic layers namely, the layers 532 and 536. The choice of thickness of the layer 534 results in a parallel or anti-parallel magnetization across the magnetic layers 532 and 536. For example, typically a thickness of 6 Å to 10 Å results in a strong anti-parallel coupling between the two adjacent magnetic layers while a thickness of 12 Å to 18 Å results in parallel coupling. The 536 layer can also have more than one layer. The layer closer to the RuX side is less amorphous but has high Ms to get higher RKKY coupling, and to get more polarization of the conduction electrons. The layer closer to the barrier side can be more amorphous as described above.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A non-volatile magnetic memory element comprising:
a bottom electrode coupled to the bit line;
a seeding layer formed on top of the bottom electrode;
a graded free layer formed on top of the seeding layer, the graded free layer having substantially perpendicular magnetic moments in a first portion thereof, the graded free layer further including a second and a third portion with the second portion being positioned the closest, relative to the first and third portions, to the tunnel layer and amorphous, the first portion being multi-layered made of a combination of materials comprising cobalt (Co), platinum (Pt) and/or palladium (Pd), and the second and third portions each having in-plane magnetic moments;
a tunnel layer formed on top of the graded free layer;
a fixed layer formed on top of the tunnel layer;
an anti-ferromagnetic pinning layer formed on top of the fixed layer;
a cap layer formed on top of the anti-ferromagnetic pinning layer; and a top electrode formed on top of the cap layer.

2. The non-volatile magnetic memory element, as recited in claim 1, wherein the multi-layered first portion is made of alternating layers.

3. The non-volatile magnetic memory element, as recited in claim 1, wherein the alternative layers is made of Co/Pt multi-layers, wherein the Co layer has a thickness of 0.2 to 0.6 nm and the Pt layer has a thickness of 0.4 to 1.2 nm.

4. The non-volatile magnetic memory element, as recited in claim 1, wherein the alternative layers is made of Pd/Co/Pt multi-layer with the multi-layer repeated 2-5 times.

5. The non-volatile magnetic memory element, as recited in claim 4, wherein the Pd layer is 0.3 to 1.2 nm thick, the Co layer is 0.2 to 0.8 nm thick, and the Pt layer is 0.6 to 1.2 nm thick.

6. The non-volatile magnetic memory element, as recited in claim 1, wherein the tunnel layer is made of material selected from a group consisting of: titanium dioxide ($TiO_2$), alumina ($Al_2O_3$), magnesium oxide (MgO), tantalum oxide ($Ta_2O_5$), hafnium oxide ($HfO_2$), zirconium oxide $ZrO_2$, tantalum nitride (TaN), strontium oxide (SrO), ruthenium oxide (RuO), and zinc oxide (ZnO).

7. The non-volatile magnetic memory element, as recited in claim 6, wherein MgO, includes less than 50 mol % of the compounds from the list of material of claim 10.

8. The non-volatile magnetic memory element, as recited in claim 1, wherein the cap layer serves to insulate the graded free layer from the top electrode and in this manner, serves to isolate the graded free layer from any micro-structural effects of the top electrode.

9. The non-volatile magnetic memory element, as recited in claim 1, wherein the cap layer serves to isolate the graded free layer from micro-structural effects associated with the top electrode.

10. The non-volatile magnetic memory element, as recited in claim 1, wherein the cap layer is made of amorphous materials selected from a group consisting of: nickel niobium (NiNb), nickel zirconium (NiZr), nickel niobium zirconium (NiNbZr), nickel silicon niobium (NiSiNb), and nickel silicon zirconium (NiSiZr).

11. The non-volatile magnetic memory element, as recited in claim 1, wherein the cap layer is made of more than one layer wherein one of the more than one layers is made of material selected from a group consisting of: copper (Cu), gold (Au) and ruthenium (Ru).

12. The non-volatile magnetic memory element, as recited in claim 1, wherein the cap layer has a thickness of less than 50 nanometers (nm).

13. The non-volatile magnetic memory element, as recited in claim 1, wherein the bottom electrode is made of a non-magnetic layer.

14. The non-volatile magnetic memory element, as recited in claim 1, wherein the bottom electrode is made of tantalum (Ta).

15. The non-volatile magnetic memory element, as recited in claim 1, wherein the pinning layer is formed to determine the direction of magnetization of the fixed layer.

16. The non-volatile magnetic memory element, as recited in claim 1, wherein the fixed layer is made of a first sub fixed layer formed on top of the pinning layer, a synthetic anti-ferromagnetic coupling layer formed on top of the first sub fixed layer and a second sub fixed layer formed on top of the synthetic anti-ferromagnetic (AF) coupling layer.

17. The non-volatile magnetic memory element, as recited in claim 1, wherein the first and second sub fixed layers are each alloys made of one or more ferromagnetic elements, such as Co, Fe and Ni, and contains less than 20 atomic percent of platinum, Pt and further contains up to 20 atomic percent of one or more of the following elements: P, B, Cr, Ta, W, Mo, Zr, and Hf.

18. The non-volatile magnetic memory element, as recited in claim 17, wherein the ferromagnetic elements of the first and second sub fixed layers are selected from a group consisting of: copper (Co), iron (Fe) and nickel (Ni) and includes less than 20 atomic percent of platinum, Pt and further includes up to 20 atomic percent of elements made of material selected from a group consisting of: P, B, Cr, Ta, W, Mo, Zr, and Hf.

19. The non-volatile magnetic memory element, as recited in claim 17, wherein the second sub fixed layer is a substantially amorphous alloy.

20. The non-volatile magnetic memory element, as recited in claim 19, wherein the second sub fixed layer is made of an alloy copper iron boron (CoFeCrB), where the boron, B, content of the alloy is between 10 to 30 atomic percent.

21. The non-volatile magnetic memory element, as recited in claim 19, wherein the second sub fixed layer and the graded free layer are amorphous and transformed into a cubic crystal structure having (002) plane parallel to the tunnel layer.

22. The non-volatile magnetic memory element, as recited in claim 1, wherein the bottom electrode has a thickness of less than 100 nanometers (nm).

23. The non-volatile magnetic memory element, as recited in claim 1, wherein pinning layer has a thickness that is less than 20 nanometers (nm).

24. The non-volatile magnetic memory element, as recited in claim 1, wherein the graded free layer has a magnetic orientation that is changeable relative to the magnetic orientation of the fixed layer, the graded free layer being made of nonmagnetic compounds surrounded by magnetic regions, the nonmagnetic compounds varying across the thickness of the graded free layer forming graded contents of oxides or nitrides and shaped substantially like an upside down cone, the graded free layer responsive to switching current that changes the magnetic orientation of the graded free layer, the magnetic orientation of the graded free layer defining a state stored by the non-volatile magnetic memory element 25. The non-volatile magnetic memory element, as recited in claim 1, wherein the nonmagnetic compound of the graded free layer has a reactivity associated therewith and wherein the graded contents have a thickness that is based on the reactivity of the non-magnetic compound.

26. The non-volatile magnetic memory element, as recited in claim 1, wherein the bottom electrode is made using reactive ion etching (RIE) process.

27. The non-volatile magnetic memory element, as recited in claim 1, wherein the fixed layer includes a first sub fixed layer formed on top of the barrier layer and on top of the first sub fixed layer is formed a synthetic anti-ferromagnetic (AF) coupling layer on top of which is formed a second sub fixed layer, wherein the AF coupling layer determines the direction of magnetization of the fixed layer.

28. A non-volatile magnetic memory element, as recited in claim 27 wherein the first sub fixed layer is made of a CoFeCrB alloy and wherein the boron, B, content of the CoFeCrB alloy is in the range of 10 to 30 atomic percent.

29. The non-volatile magnetic memory element, as recited in claim 27, wherein the first sub fixed layer and the second sub fixed layer are each graded having changing composition through the film thickness.

30. A memory cell comprising:
a bit line;
a non-volatile magnetic memory element including,
a bottom electrode coupled to the bit line;
a seeding layer formed on top of the bottom electrode;
a graded free layer formed on top of the seeding layer, the graded free layer having substantially perpendicular magnetic moments in a first portion thereof, the graded free layer further including a second and a third portion with the second portion being positioned the closest, relative to the first and third portions, to the tunnel layer and amorphous, the first portion being multi-layered made of a combination of materials comprising cobalt (Co), platinum (Pt) and/or palladium (Pd), and the second and third portions each having in-plane magnetic moments;
a tunnel layer formed on top of the graded free layer;
a fixed layer formed on top of the tunnel layer;
an anti-ferromagnetic pinning layer formed on top of the fixed layer;
a cap layer formed on top of the anti-ferromagnetic pinning layer;
a top electrode formed on top of the cap layer;
an access transistor having a source, drain and gate, the drain of the access transistor coupled to top electrode; and
a word line coupled to the gate of the access transistor, the bit line and the word line operative to select the memory cell.

31. The memory cell as recited in claim 30 further including a Program/Erase line coupled to the source of the access transistor and operative to program or erase the memory cell when the memory cell is selected.

32. The non-volatile magnetic memory element, as recited in claim 30, wherein the tunnel layer is made of material selected from a group consisting of: titanium dioxide ($TiO_2$), alumina ($Al_2O_3$), magnesium oxide (MgO), tantalum oxide ($Ta_2O_5$), hafnium oxide ($HfO_2$), zirconium oxide $ZrO_2$, tantalum nitride (TaN), strontium oxide (SrO), ruthenium oxide (RuO), and zinc oxide (ZnO).

* * * * *